United States Patent [19]

Miller

[11] 3,755,697

[45] Aug. 28, 1973

[54] LIGHT-EMITTING DIODE DRIVER

[75] Inventor: Donald K. Miller, San Jose, Calif.

[73] Assignee: Hewlett-Packard Company, Palo Alto, Calif.

[22] Filed: Nov. 26, 1971

[21] Appl. No.: 202,475

[52] U.S. Cl. ................ 307/311, 328/2, 250/217 SS

[51] Int. Cl. ............................................ H03k 17/00

[58] Field of Search ............... 250/217 SS; 307/311, 307/308, 238; 328/2

[56] References Cited

UNITED STATES PATENTS

| | | | |
|---|---|---|---|
| 3,534,351 | 10/1970 | Harnder, Jr. et al. | 307/311 |
| 3,462,605 | 8/1969 | Engeler | 250/217 SS |
| 3,384,837 | 5/1968 | Toussaint et al. | 250/217 SS |
| 3,666,960 | 5/1972 | Dawson | 307/311 |

*Primary Examiner*—John W. Huckert
*Assistant Examiner*—B. P. Davis
*Attorney*—Stephen P. Fox

[57] ABSTRACT

A transistor is driven into conduction by pulses from an external signal source and has an inductance for a collector load. A light-emitting diode (LED) is connected across the inductance and is forward-biased for a short period each time after the transistor ceases conduction. Repetitive pulsing of the LED produces illumination at low-average current consumption.

6 Claims, 4 Drawing Figures

LIGHT-EMITTING DIODE DRIVER

BACKGROUND OF THE INVENTION

This invention relates generally to a circuit for driving a light-emitting diode (LED) in a manner to increase operating efficiency.

To emit light, an LED must be forward-biased, at which time a very low resistance exists therethrough. In order to prevent irreversible damage or premature aging of the LED, it is necessary to limit the current therethrough. Heretofore, one method of achieveing this has been to connect a current-limiting resistance element in series with the LED. However, power dissipation in the resistance element causes a reduction in over-all circuit efficiency because only a portion of the power input to the circuit is applied to the LED to produce light. The value of the current-limiting resistance, and thus the power dissipated therein, can be reduced somewhat by lowering the LED supply voltage. The effectiveness of this technique is limited because as the supply voltage approaches the "knee" of the voltage-current diode curve, small variations in supply voltage result in large variations in peak diode current. Also, the conventional approach will not work for supply voltages lower than the diode knee voltage as diode conduction and light emission essentially cease at this point.

In the past, most LED drivers have been configured to continuously drive the associated LED. It has been found that LED's presently commercially available demonstrate greater efficiency in converting electrical energy to light energy when the LED is forward-biased in a pulsed mode rather than in a continuous mode of operation.

It is the principle object of the present invention to provide a simplified LED driver circuit having improved efficiency in power conversion and capable of being constructed at low cost.

SUMMARY OF THE INVENTION

According to one of the illustrated embodiments of the invention, a transistor has an inductive load coupled to its collector and is driven by repetitively occurring pulses from an external source. An LED is coupled across the inductive load. The transistor is pulsed to switch it into a conductive mode, thereby to build up energy in the inductive load. At this time, the LED is reverse-biased and consequently inactive. At the termination of a driving pulse, the energy stored in the inductive load produces a current flow through the LED, thereby to cause it to operate in a light-emitting mode. The repetition rate and magnitude of current pulses through the LED are adjusted so that the light pulses emitted thereby appear to be continuous to the eye of an observer.

Peak current through the LED is precisely controlled without the use of a resistor in series therewith. Such peak current control permits limiting of the current so as to prevent damage to or premature aging of the LED.

The over-all circuit increases the operating efficiency of the LED with a minimum number of components because there are no lumped resistive elements in series with the LED and because the LED is operated in a pulsed mode rather than in a continuous mode. A feature of the circuit arrangement of the present invention is that the LED's and their associated drivers may easily be arrayed to form a large display.

DESCRIPTION OF THE PREFERRED EMBODIMENTS

Figure 1:
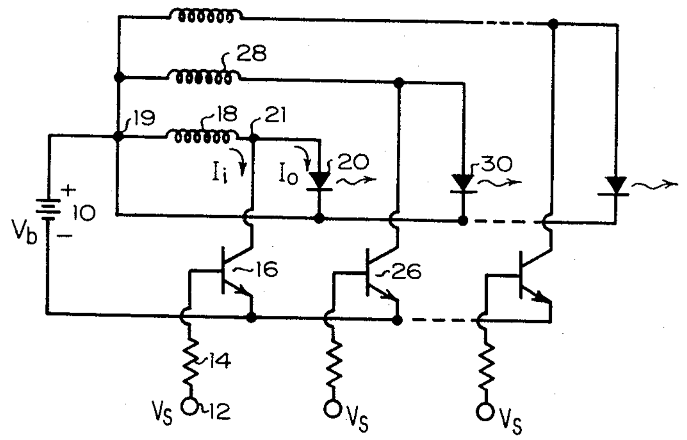
FIG. 1 is a schematic diagram representation of one embodiment of the present invention used in an array to drive a plurality of LED's.

Referring now to FIG. 1, a pulse signal $V_s$ from an external signal source is applied to an input terminal 12 and thence through a resistor 14 to the base electrode of an NPN transistor 16. Resistor 14 serves to limit the base current of transistor 16. The collector of transistor 16 is connected through an inductive load 18 to a power source 10 providing a voltage $V_b$. A light-emitting diode (LED) 20 is coupled across the inductor 18 as shown. The negative return line from power source 10 is connected to the emitter of transistor 16.

In the absence of pulses at terminal 12, transistor 16 is cutoff and no current flows in the circuit. At this time, LED 20 is nonconducting and does not emit light.

Figure 2:
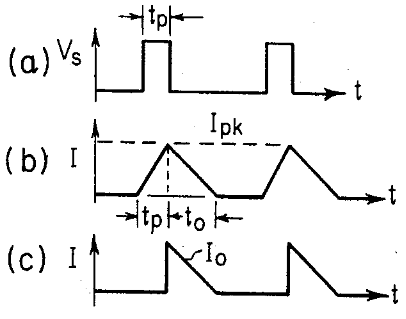
FIGS. 2*a–c* are waveforms illustrating the operation of the circuit of the present invention.

The pulses applied to terminal 12 are shown in FIG. 2a. Each pulse is positive-going, and when applied to the base electrode of transistor 16, the transistor is switched into a conducting mode of operation. This is turn causes the current in inductor 18 to build up linearly with time to a peak value $I_{pk}$ given by the expression $(V_b t_p/L)$, where $V_b$ is the voltage of power source 10, $t_p$ is the pulse duration, and L is the value of the inductor 18. During this current build-up time, the voltage at one end of inductor 18, i.e., at point 19, is greater than the voltage at the other end point 21. LED 20 is poled with its anode connected to end point 21 and its cathode connected to end point 19 so that the LED is maintained in a reverse-biased condition and conducts only a small leakage current. The direction of the input current $I_i$ through inductor 18 and transistor 16 is shown in FIG. 1.

At the end of the positive pulse applied to terminal 12, transistor 16 is switched into its nonconducting mode. Thereafter, the energy stored in inductor 18 produces an output current flow through LED 20, thereby to forward-bias the LED and drive it into a light-emitting mode of operation. The direction of this output current $I_o$ applied through LED 20 by inductor 18 is shown in FIG. 1.

FIG. 2*b* illustrates the current through inductor 18 as a time related function of the pulses applied to terminal 12 shown in FIG. 2*a*. The input current $I_i$ occurs during the time interval $t_p$ corresponding to the duration of an input pulse. The inductor output current $I_o$ occurs during the time interval $t_o$ which begins at the end of the input pulse. The instantaneous current through inductor 18 remains the same when the input pulse terminates and transistor 16 switches from its conducting to non-conducting state. Therefore, the initial value of the output current $I_o$ through LED 20 is the same as the value of the input current $I_t$ which was reached at the end of the input pulse.

The output current $I_o$ through LED 20 is shown in FIG. 2*c*. Current $I_o$ continues to flow at an approximately linearly decreasing value until it reaches zero. Thereafter, light emission ceases and the LED driver circuit remains in a quiescent state with no current flowing therein until the arrival of the next positive pulse at terminal 12.

The peak current through LED 20 occurs at the time when transistor 16 switches from its conducting to its nonconducting state. The peak current value is established by the parameters which determine the energy stored in inductor 18. For a given supply voltage $V_b$ and a given value of inductance for inductor 18 the width $t_p$ of the pulses comprising signal $V_s$ applied to terminal 12 can be varied to optimize the peak current through LED 20 for the amount of light produced thereby. By comparing FIGS. 2*a* and 2*b*, it can be seen that the greater the pulse width $t_p$ the higher will be the peak current $I_{pk}$. A feature of the present invention is that the magnitude of peak current may be precisely controlled by adjusting the width of the input pulses. The use of a current-limiting resistor in series with the LED is unnecessary. The voltage source 10 may be coupled across the LED, as shown. In addition, the voltage $V_b$ of source 10 may be less than that at the "knee" of the characteristic voltage-current curve for the LED. More specifically, for a typical gallium arsenide phosphide LED, the voltage at the "knee" of this curve is about 1.6 volts, i.e., the LED conducts heavily when the anode-cathode voltage is greater than 1.6 volts, whereas for lower anode-cathode voltages, the LED conducts only a small leakage current. Due to the effects of inductor 18, LED 20 will be driven into conduction even though the voltage $V_b$ of source 10 is less than 1.6 volts. A consequent advantage of this feature is that a conventional battery having a terminal voltage on the order of 1.4 volts may be used as the power source 10.

Figure 3:
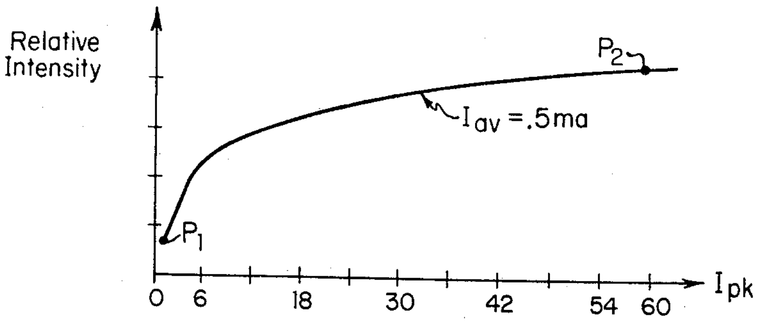
FIG. 3 is a characteristic curve illustrating the relative light intensity from an LED as a function of the peak driving current applied thereto.

FIG. 3 illustrates the relationship between the relative intensity of the light output from LED 20 as a function of the peak current $I_{pk}$ input thereto. The curve shown is for the case where the average current $I_{av}$ through the LED 20 is constant. The average current $I_{av}$ is held constant as the peak current $I_{pk}$ increases by reducing the duty cycle of the pulses comprising the input signal $V_s$. The curve shown in FIG. 3 is for a typical gallium arsenide phosphide LED such as the No. 5082–7212 manufactured by Hewlett-Packard Company, 1501 Page Mill Road, Palo Alto, California. Pulsed mode operation of the LED substantially increases the intensity of the light output from the LED compared to d.c. operation of the LED at the same average current. More specifically, d.c. operation of the LED is shown at point $P_1$, where the peak current $I_{pk}$ is the same as the average current $I_{av}$, both being equal to 0.5 milliamp. At point $P_1$ the light output from the LED is 0.7 on the relative intensity scale. All other points on the curve of FIG. 3 illustrate operation of the LED in the pulsed mode. At operating point $P_2$, for example, the current pulses through the LED have a peak current value of 60 milliamps. In order to hold the average current the same as in the d.c. operating case, the duty cycle of the current pulses is small, on the order of 0.9 percent. Such a duty cycle may be achieved, for example, when the current pulses are 2.5 microseconds long and occur at 280 microsecond intervals. It can be seen that the relative light intensity at the pulsed mode operating point $P_2$ is 4.4, which is about 6 times greater than the light intensity at the d.c. mode operating point $P_1$.

The frequency of the pulses comprising input signal $V_s$ may be varied to establish the minimum number of pulses per second which are required to produce a visible display that appears steady without flickering.

Transistor 16 may be replaced by any suitable switching device capable of performing a like switching function. If a transistor is used, its $\beta$ should be high and its $V_{CE(Sat)}$ should be low to minimize resistive losses. The LED 20 should have a reverse breakdown voltage rating that is greater than the voltage $V_b$ of power source 10.

The circuit described above can be easily arrayed by coupling a plurality of such circuits in parallel. FIG. 1 illustrates how additional LED's and their associated driver circuits may be coupled to the common power source 10. For example, as shown, a second LED 30 and associated transistor 26 and inductor 28 are coupled in a circuit configuration which is the same as that described above with respect to LED 20, transistor 16 and inductor 18. The peak current through each LED is dependent on the pulse width $t_p$ of the pulses comprising the driving signal $V_s$. Since the same type of driving signal is applied to all LED circuits, the peak current through each will be the same. Consequently, the intensity of the light output from each will be the same for identical LED's and the display produced by the plurality of LED's in the array will be of uniform intensity.

Figure 4:
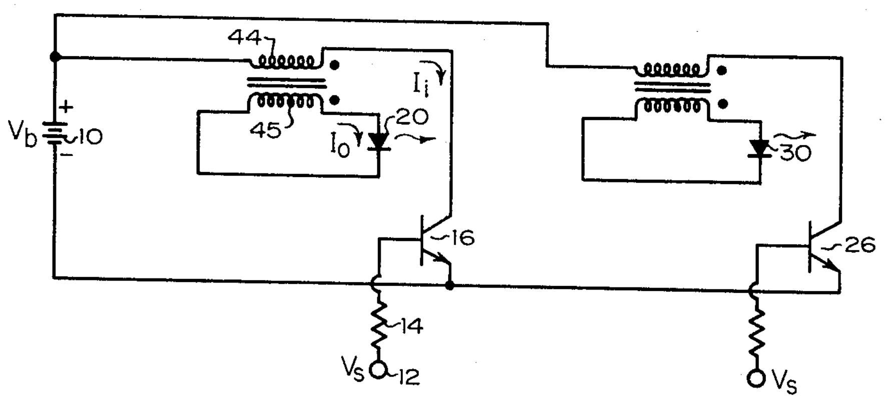
FIG. 4 is a schematic diagram representing another embodiment of the present invention.

FIG. 4 illustrates the circuit of the present invention in another embodiment. This circuit is the same as that in FIG. 1 except that the inductance 18 is replaced with a transformer having a primary winding 44 and a secondary winding 45. This circuit may be used in applications requiring d.c. isolation of the LED's from the power source 10. In FIG. 4, the LED 20 is coupled across the secondary winding 45. Current from power source 10 through transistor 16 causes energy to build up in the magnetic field through the primary winding 44. This energy is transferred through secondary winding 45 to LED 20. The LED is poled so that when transistor 16 switches to its nonconducting state in response to the end of the input pulse at terminal 12, the output current $I_o$ flows therethrough. The current through LED 20 is the same shape as that shown in FIG. 2c described above; however, the magnitude thereof will depend on the transformer winding ratio. For example, when a step-up transformer is used, small currents switched by transistor 16 will cause a large current flow through the LED.

As shown in FIG. 4, a plurality of LED circuits may be connected in parallel to the power source 10. The array thus formed is similar to that described with respect to FIG. 1.

I claim:

1. A circuit comprising:

a light-emitting diode;

inductance means coupled in parallel with said light-emitting diode;

a voltage source;

means for coupling said voltage source to the parallel combination of said light-emitting diode and said inductance means, said coupling means including switching means for applying current pulses to said light-emitting diode, said switching means being operable in a first conductive mode to store energy in said inductance means, and in a second nonconductive mode to produce current flow from said inductance means through said light-emitting diode.

2. The circuit of claim 1 wherein said inductance means is a single inductor element having one end terminal connected to said switching means and the other end terminal connected to said voltage source, and wherein said coupling means is configured to reverse-bias said light-emitting diode in said first conductive mode of operation.

3. The circuit of claim 1, wherein said inductance means includes a transformer having primary and secondary windings, said primary winding being coupled by said coupling means to said voltage source, and said secondary winding being coupled to said light-emitting diode, thereby to provide d.c. isolation of said voltage source from said light-emitting diode.

4. The circuit of claim 1 wherein said switching means is a transistor having control electrode means for receiving input pulses, and a pair of main current-carrying electrodes coupled in series between said voltage source and the parallel combination of said inductance means and said light-emitting diode.

5. The circuit of claim 1, wherein said light-emitting diode and said voltage source each have a pair of opposite polarity terminals, and wherein said coupling means is configured to couple each terminal of said light-emitting diode to the opposite polarity terminal of the voltage source.

6. The circuit of claim 5, wherein said light-emitting diode has an anode and a cathode electrode and said voltage source has a positive and a negative output terminal, and wherein said coupling means is configured to connect said anode electrode to said negative output terminal through said switching means and to connect said cathode electrode to said positive output terminal.

* * * * *

UNITED STATES PATENT OFFICE

CERTIFICATE OF CORRECTION

Patent No. 3,755,697 Dated August 28, 1973

Inventor(s) Donald K. Miller

It is certified that error appears in the above-identified patent and that said Letters Patent are hereby corrected as shown below:

Column 1, line 11, "achieveing" should read -- achieving --; line 35, "principle" should read -- principal --.

Signed and sealed this 12th day of March 1974.

(SEAL)
Attest:

EDWARD M.FLETCHER,JR.
Attesting Officer

C. MARSHALL DANN
Commissioner of Patents